United States Patent
Hosaka et al.

(10) Patent No.: US 10,855,282 B2
(45) Date of Patent: Dec. 1, 2020

(54) BUFFER CIRCUIT

(71) Applicant: Micron Technology, Inc., Boise, ID (US)

(72) Inventors: Hiroki Hosaka, Sagamihara (JP); Satoru Sugimoto, Sagamihara (JP); Hayato Oishi, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/507,350

(22) Filed: Jul. 10, 2019

(65) Prior Publication Data

US 2020/0112312 A1    Apr. 9, 2020

Related U.S. Application Data

(63) Continuation of application No. 16/151,274, filed on Oct. 3, 2018, now Pat. No. 10,389,359.

(51) Int. Cl.
| | | |
|---|---|---|
| *H03K 19/0175* | (2006.01) | |
| *H01L 23/62* | (2006.01) | |
| *H03K 19/0185* | (2006.01) | |
| *G11C 5/14* | (2006.01) | |
| *H01L 29/08* | (2006.01) | |
| *H01L 27/092* | (2006.01) | |
| *H01L 27/06* | (2006.01) | |

(52) U.S. Cl.
CPC ..... *H03K 19/018521* (2013.01); *G11C 5/148* (2013.01); *H01L 27/0629* (2013.01); *H01L 27/092* (2013.01); *H01L 29/0847* (2013.01)

(58) Field of Classification Search
CPC .... H03K 19/018521; H03K 19/018571; H01L 29/10; H01L 29/1025; H01L 29/1066; H01L 29/0843
See application file for complete search history.

(56) References Cited

U.S. PATENT DOCUMENTS

| | | | |
|---|---|---|---|
| 6,094,068 A | 7/2000 | Nomura et al. | |
| 6,229,186 B1 * | 5/2001 | Ishida | G11C 11/412 |
| | | | 257/206 |
| 7,719,895 B2 * | 5/2010 | Kucic | G11C 16/0441 |
| | | | 365/185.05 |
| 7,732,864 B2 | 6/2010 | Kawahara et al. | |
| 9,412,742 B2 * | 8/2016 | Fujiwara | G06F 30/394 |

OTHER PUBLICATIONS

U.S. Appl. No. 16/151,274, titled "Buffer Circuit", filed Oct. 3, 2018.

* cited by examiner

*Primary Examiner* — An T Luu

(74) *Attorney, Agent, or Firm* — Dorsey & Whitney LLP

(57) ABSTRACT

Apparatuses for providing buffer circuits a semiconductor device are described. An example apparatus includes a plurality of inverters and a transistor having one diffusion region coupled to a diffusion region of a transistor of one inverter of the plurality of inverters, another diffusion region coupled to a diffusion region of a transistor of another inverter of the plurality of inverters. The transistor having a gate coupled to one power supply voltage and diffusion regions coupled to another power supply voltage functions as a power voltage compensation capacitor.

19 Claims, 12 Drawing Sheets

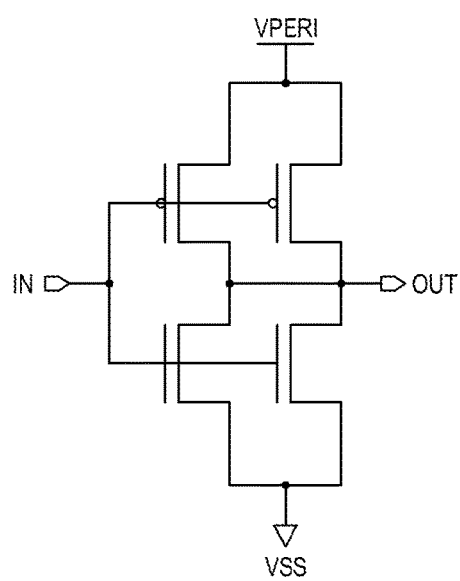
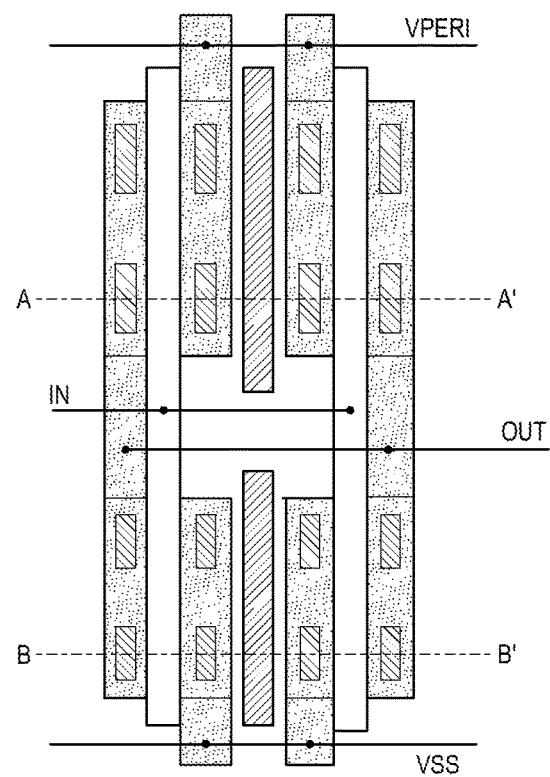
FIG. 1A
(Prior Art)
FIG. 1B
(Prior Art)

US 10,855,282 B2

BUFFER CIRCUIT

CROSS-REFERENCE TO RELATED APPLICATION(S)

This application is a continuation of U.S. patent application Ser. No. 16/151,274 filed Oct. 3, 2018 and issued as U.S. Pat. No. 10,389,359 on Aug. 20, 2019 which are incorporated herein by reference, in their entirety, for any purpose.

BACKGROUND

High data reliability, reduced chip size, reduced power consumption and efficient power usage are features that are demanded from semiconductor memory. In order to enhance current driving capability while suppressing chips size increase, a buffer circuit in a conventional semiconductor device includes a plurality of transistors coupled in parallel to each other.

For example, an inverter buffer circuit includes a plurality of p-channel field-effect transistors and a plurality of n-channel field-effect transistors. The plurality of p-channel field-effect transistors are coupled in parallel to each other between a power supply voltage line for a power supply voltage (e.g., VPERI, VDD) and an output node, and the plurality of n-channel field-effect transistors are coupled in parallel to each other between another power supply voltage line for reference voltage (e.g., VSS, Ground) that is different from the power supply voltage (e.g., the reference voltage is lower than the power supply voltage), and the output node. Gates of the p-channel and n-channel field-effect transistors are coupled in common to an input node. As the plurality of p-channel field-effect transistors are coupled in parallel to each other, the adjacent two transistors of the plurality of p-channel field-effect transistors are formed to share a common source region (P-type) with each other. Similarly, the adjacent two transistors of the plurality of n-channel field-effect transistors are formed to share a common source region (N-type) with each other. Sharing a common source region causes increase in current density at the common source region that results in large voltage drop (IR drop) of a source potential. To avoid such large voltage drop, recent conventional semiconductor devices tend to include a plurality of transistors coupled in parallel to each other has been fabricated with an individual and separated source region. Thus, the source regions of the adjacent transistors have been separated from each other.

FIG. 1A is a circuit diagram of a conventional inverter buffer including two p-channel field-effect transistors and two n-channel field-effect transistors. FIG. 1B is a layout diagram of the conventional inverter buffer. FIG. 1C is a schematic diagram of the conventional inverter buffer and includes a cross sectional view along a line A-A' in FIG. 1B of the adjacent p-channel filed effect transistors and a cross sectional view along a line B-B' in FIG. 1B of the adjacent n-channel filed effect transistors. As shown, the source regions of the two p-channel filed effect transistors are separated from each other by a shallow trench isolation (STI) to avoid large IR drop. Similarly, the source regions of the two n-channel filed effect transistors are separated from each other by another STI. Each box over the STI is a dummy gate that is formed (or patterned) simultaneously with gates of the p-channel filed effect transistors and N-channel filed effect transistors in order to achieve uniformity in forming the gates of the transistors. However, such separation causes increase in chip size and complication of layout patterns, if combined with other layout restraints.

BRIEF DESCRIPTION OF THE DRAWINGS

FIG. 1A is a circuit diagram of a conventional inverter buffer including two p-channel field-effect transistors and two n-channel field-effect transistors.

FIG. 1B is a layout diagram of the conventional inverter buffer.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1C:
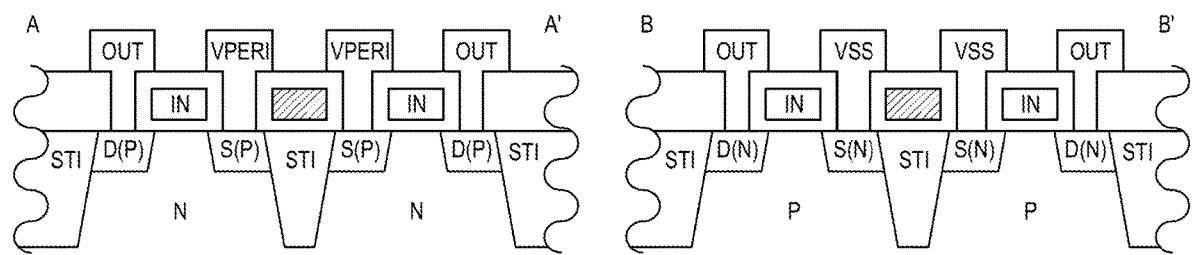
FIG. 1C is a schematic diagram of the conventional inverter buffer.
Figure 2:
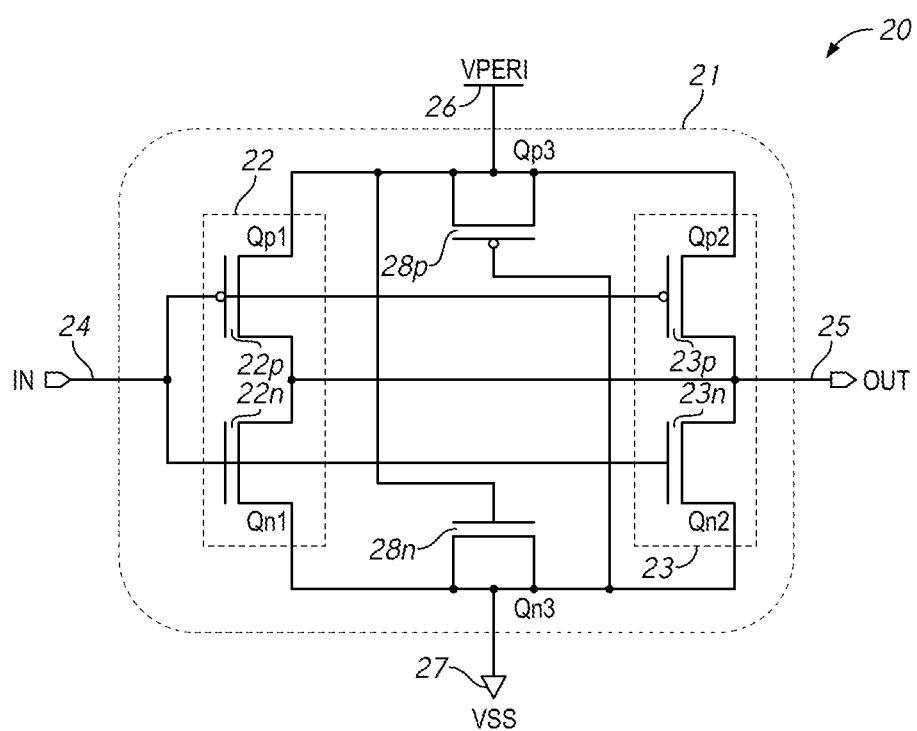
FIG. 2 is a circuit diagram of an apparatus including a buffer circuit according to an embodiment of the present disclosure.

FIG. 2 is a circuit diagram of an apparatus 20 including a buffer circuit 21 according to an embodiment of the present disclosure. The buffer circuit 21 may be an inverter buffer circuit. The inverter buffer circuit 21 may include a first inverter 22 and a second inverter 23. The first inverter 22 may include a transistor Qp1 22p of a first type and a transistor Qn1 22n of a second type that is of a different polarity from the transistor Qp1 22p. The second inverter 23 may include a transistor Qp2 23p of the first type and a transistor Qn2 23n of the second type that is of a different polarity from the transistor Qp2 23p. For example, the transistors 22p and 23p of the first type may be p-channel field effect transistors and the transistors 22n and 23n of the second type may be n-channel field effect transistors. Each of the transistors Qp1 22p and Qp2 23p may include diffusion regions (e.g., source and drain regions) arranged to define one channel region and a gate over the one channel region. Each of the transistors Qn1 22n and Qn2 23n may include may include diffusion regions (e.g., source and drain regions) arranged to define another channel region of a different polarity from the one channel region and a gate over the other channel region. The first inverter 22 and the second inverter 23 may be coupled in parallel to each other among an input node IN 24, an output node OUT 25, a power supply voltage line (e.g., VPERI 26 that may provide a power supply voltage) and another power supply voltage line (e.g., VSS 27 that may provide a reference voltage), thus the gates of the transistors Qp1 22p, 22n, 23p and 23n may receive an input signal from the input node IN 24 and one of the diffusion regions (e.g., drain regions) of the transistors Qp1 22p, 22n, 23p and 23n may provide an output signal to the output node OUT 25.

The inverter buffer circuit 21 may further include a transistor Qp3 28p and a transistor Qn3 28n. One of source and drain regions of the transistor Qp3 28p may be shared with a source region of the transistor Qp1 22p and the other of the source and drain regions of the transistor Qp3 28p may be shared with a source region of the transistor Qp2 23p. Thus, the transistor Qp3 28p may be disposed between the transistors Qp1 22p and Qp2 23p and one diffusion region (e.g., a source region) of the transistor Qp1 22p and one diffusion region (e.g., a source region) of the transistor Qp2 23p may define another channel region. The source and drain regions of the transistor Qp3 28p, the source regions of the transistors Qp1 22p and Qp2 23p may be coupled to the power supply voltage line VPERI 26. The transistor Qp3 28p may include a gate over the other channel region. The gate of the transistor Qp3 28p may provide an inversion region in the channel region to couple the source regions of the transistors Qp1 22p and Qp2 23p. Furthermore, the gate of the transistor Qp3 28p may be coupled to the other power supply voltage line VSS 27. Thus, the transistor Qp3 28p may function as a capacitor coupled between the power supply voltage lines VPERI 26 and VSS 27. Similarly, one of source and drain regions of the transistor Qn3 28n may be shared with a source region of the transistor Qn1 22n and the other of source and drain regions of the transistor Qn3 28n may be shared with a source region of the transistor Qn2 23n. Thus, the transistor Qn3 28n is disposed between the transistors Qn1 22n and Qn2 23n and one diffusion region (e.g., a source region) of the transistor Qn1 22n and one diffusion region (e.g., a source region) of the transistor Qn2 23n may define another channel region. The source and drain regions of the transistor Qn3 28n, the source regions of the transistors Qn1 22n and Qn2 23n may be coupled to the power supply voltage line VSS 27. The transistor Qn3 28n may include a gate over the other channel region. The gate of the transistor Qn3 28n may provide an inversion region in the channel region to couple the source regions of the transistors Qn1 22n and Qn2 23n. Furthermore, the gate of the transistor Qn3 28n may be coupled to the power supply voltage line VPERI 26. Thus, the transistor Qn3 28n may function as a capacitor coupled between the power supply voltage lines VPERI 26 and VSS 27. The capacitors formed by the transistors Qp3 28p and Qn3 28n may operate as power voltage compensation capacitors that suppress fluctuations in power supply voltages on the power supply voltage lines VPERI 26 and VSS 27 during transitions of the output node OUT 25 from one voltage to another voltage (e.g., VPERI to VSS or VSS to VPERI) due to switching operations of the transistors Qp1 22p, Qp2 23p, Qn1 22n and Qn2 23n.

Figure 3:
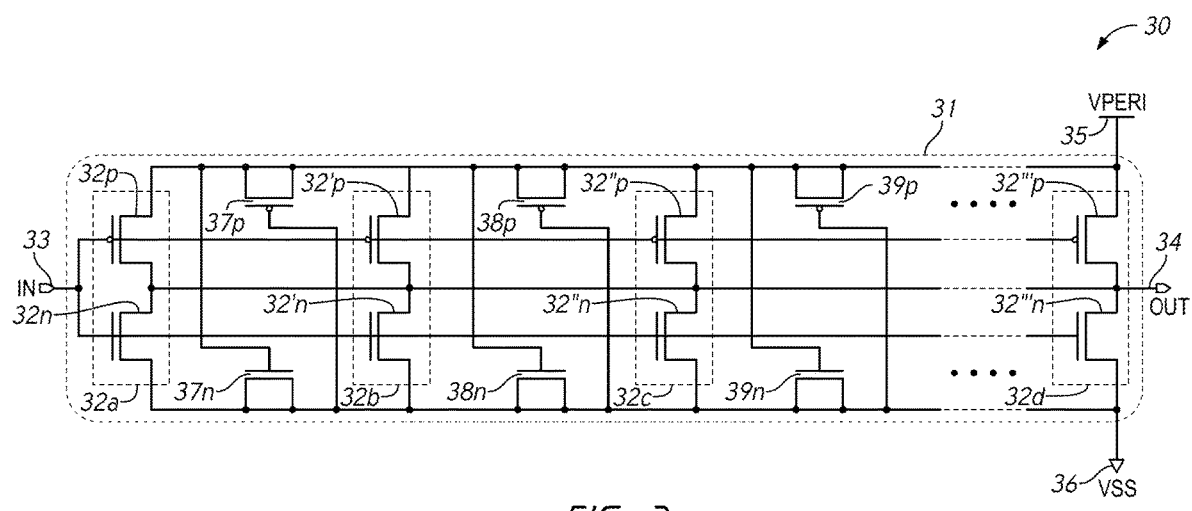
FIG. 3 is a circuit diagram of an apparatus including a buffer circuit according to an embodiment of the present disclosure.

FIG. 3 is a circuit diagram of an apparatus 30 including a buffer circuit 31 according to an embodiment of the present disclosure. The buffer circuit 31 may be an inverter buffer circuit. The inverter buffer circuit 31 may include a plurality of inverters 32a, 32b, 32c and 32d that may be coupled in parallel to each other among an input node IN 33, an output node OUT 34, a power supply voltage line VPERI 35 and another power supply voltage line VSS 36. The inverter 32a may include a transistor 32p of a first type and a transistor 32n of a second type that is of a different polarity from the transistor 32p. The inverter 32b may include a transistor 32'p of the first type and a transistor 32'n of the second type. The inverter 32c may include a transistor 32"p of the first type and a transistor 32"n of the second type. The inverter 32d may include a transistor 32'''p of the first type and a transistor 32'''n of the second type. For example, the transistors 32p, 32'p, 32"p and 32'''p of the first type may be p-channel field effect transistors and the transistors 32n, 32'n, 32"n and 32'''n of the second type may be n-channel field effect transistors. The inverters 32a, 32b, 32c and 32d may be coupled in parallel to each other among an input node IN 33, an output node OUT 34, a power supply voltage line VPERI 35 and another power supply voltage line VSS 36.

The inverter buffer circuit 31 may further include transistors 37p, 38p, and 39p of the first type and transistors 37n, 38n and 39n of the second type. The transistor 37p may include source and drain regions. One of source and drain regions of the transistor 37p may be shared with a source region of the transistor 32p and the other of the source and drain regions of the transistor 37p may be shared with a source region of the transistor 32'p. Thus, the transistor 37p may be disposed between the transistors 32p and 32'p. Similarly, the transistor 38p may be disposed between the transistors 32'p and 32"p. One of the source and drain regions of the transistor 39p may be shared with a source region of the transistor 32"p. The source and drain regions of the transistors 37p, 38p and 39p and the source regions of the transistors 32p, 32'p, 32"p and 32'''p may be coupled to the power supply voltage line VPERI 35. Each of the transistors 37p, 38p and 39p includes a gate that may be coupled to the other power supply voltage line VSS 36. Thus, the transistors 37p, 38p and 39p may function as capacitors coupled between the power supply voltage lines VPERI 35 and VSS 36. The transistor 37n may include source and drain regions. One of source and drain regions of the transistor 37n may be shared with a source region of the transistor 32n and the other of the source and drain regions of the transistor 37n may be shared with a source region of the transistor 32'n. Thus, the transistor 37n may be disposed between the transistors 32n and 32'n. Similarly, the transistor 38n may be disposed between the transistors 32'n and 32"n.

One of the source and drain regions of the transistor 39n may be shared with a source region of the transistor 32"n. The source and drain regions of the transistors 37n, 38n and 39n and the source regions of the transistors 32n, 32'n, 32"n and 32'''n may be coupled to the power supply voltage line VSS 36. Each of the transistors 37n, 38n and 39n includes a gate that may be coupled to the other power supply voltage line VPERI 35. Thus, the transistors 37n, 38n and 39n may function as capacitors coupled between the power supply voltage lines VPERI 35 and VSS 36. In accordance with increase in a number of the inverters 32a, 32b, 32c, . . . 32d, the capacitors are increased in number, because each transistor of the transistors of the first type (e.g., transistors 37p, 38p) is disposed between adjacent two transistors of the first type (e.g., transistors 32p and 32'p, 32'p and 32"p) in adjacent inverters of the inverters 32a, 32b, 32c, etc., and each transistor of the transistors of the second type (e.g., transistors 37n, 38n) is disposed between adjacent two transistors of the second type (e.g., transistors 32n and 32'n, 32'n and 32"n) in adjacent inverters of the inverters 32a, 32b, 32c, etc.

Figure 4A:
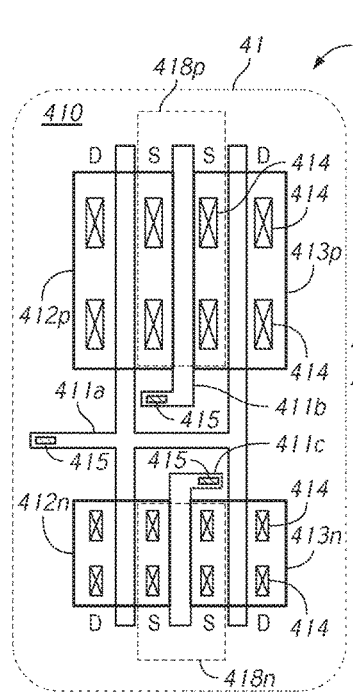
FIGS. 4A to 4C are layout diagrams of layers in a buffer circuit according to an embodiment of the present disclosure.
Figure 4B:
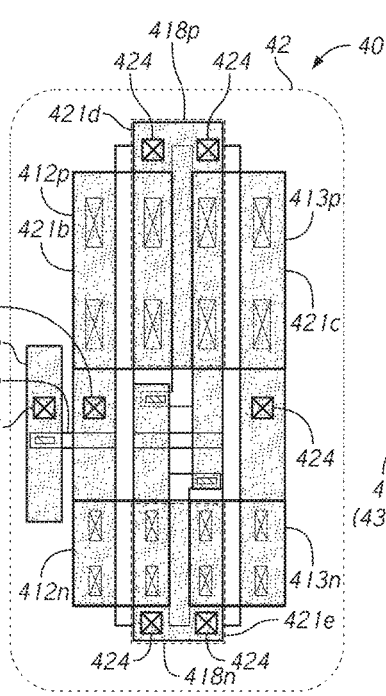
Figure 4C:
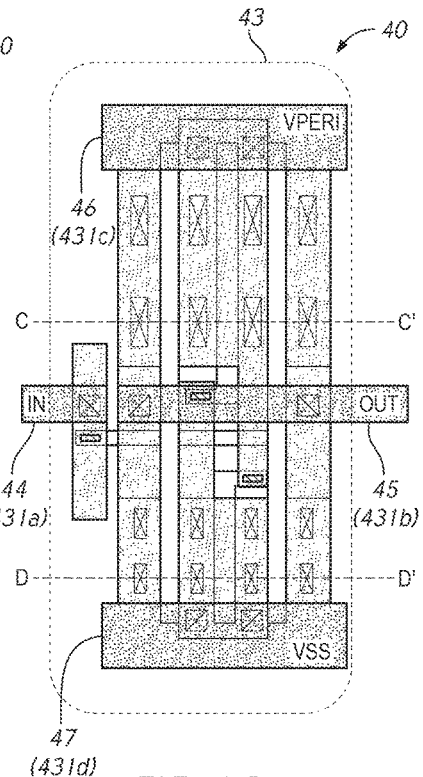
Figure 4D:
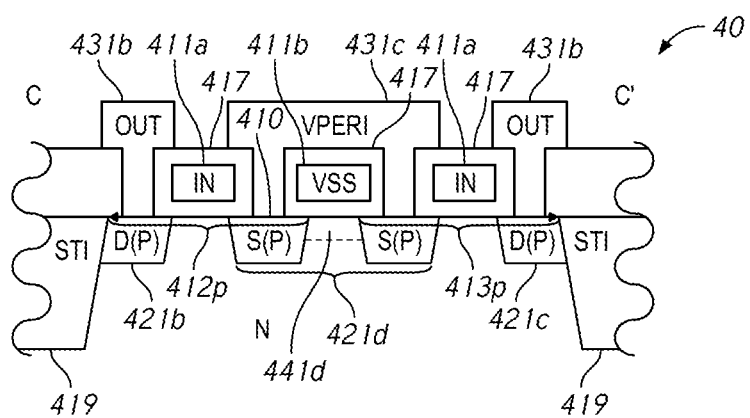
FIG. 4D is a schematic diagram of transistors in the buffer circuit according to an embodiment of the present disclosure.
Figure 4E:
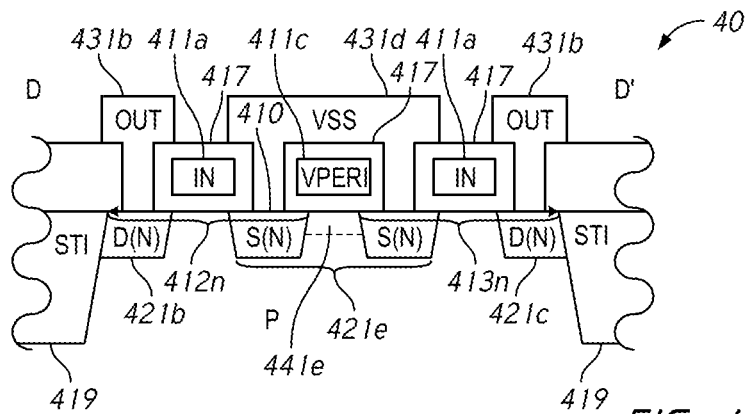
FIG. 4E is a schematic diagram of transistors in the buffer circuit according to an embodiment of the present disclosure.

FIGS. 4A to 4C are layout diagrams of layers 41, 42 and 43, respectively, in a buffer circuit 40 according to an embodiment of the present disclosure. The buffer circuit 40 may be an inverter buffer circuit. FIG. 4D is a schematic diagram of transistors 412p and 413p in the buffer circuit 40 according to an embodiment of the present disclosure. FIG. 4E is a schematic diagram of transistors 412n and 413n in the buffer circuit 40 according to an embodiment of the present disclosure. FIGS. 4A to 4C are plan views of the layers 41, 42 and 43 in the buffer circuit 40 of multi-level wiring structure. FIGS. 4D and 4E are cross sectional views of the buffer circuit 40 along lines C-C and D-D' shown in FIG. 4C.

In FIG. 4A, a common gate electrode 411a provided on or over a region 410 of the layer 41 functions as gates of the transistors 412p, 412n, 413p, 413n. Also, a gate electrode 411b that functions as a gate of a transistor 418p and a gate electrode 411c that functions as a gate of a transistor 418n may be provided on or over the region 410 of the layer 41 in a similar manner. The transistors 418p and 418n may function as capacitors between power supply voltages VPERI 46 and VSS 47. The transistors 412p, 413p and 418p may be of the first type (e.g., p-channel field effect transistors) and the transistors 412n, 413n and 418n may be of the second type (e.g., n-channel field effect transistors). The transistors 412p and 412n may be used as the transistors 22p and 22n in the inverter 22 in FIG. 2 and the transistors 413p and 413n may be used as the transistors 23p and 23n in the inverter 23 in FIG. 2. Each gate electrode of the gate electrodes 411a, 411b and 411c may be coated by a dielectric film 417 and formed over the region 410 that may be defined by STI 419 in FIG. 4D. The gate electrodes of the transistors 412p, 412n, 413p, 413n may be coupled in common as the common gate electrode 411a. By masking with the STI 419 and the gate electrodes 411a, 411b, 411c, impurity implantation/diffusion may form source and drain regions of the transistors 412p, 412n, 413p, 413n, 418p and 418n. The source regions of the adjacent two transistors 412p and 413p may be separated by the gate of the transistor 418p, where the transistor 418p includes the source and drain regions shared with the source regions of the adjacent two transistors 412p and 413p of the inverters (e.g., the inverters 22 and 23 in FIG. 2), respectively. The source regions of the adjacent two transistors 412n and 413n may be separated by the gate of the transistor 418n where the transistor 418n includes the source and drain regions shared with the source regions of the adjacent two transistors 412n and 413n of the inverters (e.g., the inverters 22, 23 in FIG. 2), respectively. An interlayer insulating film (not shown) may be then deposited over an entire surface of the layer 41. A plurality of contact holes 415 may be formed therein to expose portions of the common gate electrode 411a of the transistors 412p, 412n, 413p, 413n, and the gates 411b and 411c of the transistors 418p and 418n. Furthermore, contact holes 414 may be formed to expose portions of the source and drain regions of transistors 412p, 412n, 413p, 413n, 418p and 418n.

In FIG. 4B, the layer 42 may be a first-level conductive layer on the layer 41. For example, a metal layer of Tungsten (W) may be deposited over the entire surface and a pattern may be provided to form the first-level conductive layer including interconnects 421a, 421b, 421c, 421d, 421e. The interconnect 421a may be coupled through the contact hole 415 to the common gate electrode 411a, and may provide an input signal of the transistors 412p, 412n, 413p and 413n. The interconnect 421b may couple the drain regions of transistors 412p and 412n in one inverter and the interconnect 421c may couple the drain regions of transistors 413p and 413n in one inverter. The interconnect 421d may couple the gate of the transistor 418n to the source regions of the transistors 412p and 413p that are the source and drain regions of the transistor 418p. The interconnect 421e may couple the gate of the transistor 418p to the source regions of the transistors 412n and 413n that are the source and drain regions of the transistor 418n. Another interlayer insulating film (not shown) may be then deposited over the entire surface of the layer 42. A plurality of contact holes 424 may be formed therein to expose portions of the interconnects 421a to 421e.

In FIG. 4C, the layer 43 may be a second-level conductive layer on the layer 42. For example, another metal layer of Copper (Cu) may be deposited over the entire surface and pattern may be provided to form a second-level conductive layer including interconnects 431a, 431b, 431c and 431d. The interconnect 431a functions as an input node IN 44 that may be coupled to the interconnect 421a through the contact hole 424 on the interconnect 421a. The interconnect 431b functions as an output node OUT 45 that may be coupled to the interconnects 421b and 421c through the contact holes 424 on the interconnects 421b and 421c. The interconnect 431c may be a power supply voltage line VPERI 46 coupled to the interconnect 421d through the contact holes 424 on the interconnect 421d. The interconnect 431d may be another power supply voltage line VSS 47 coupled to the interconnect 421e through the contact holes 424 on the interconnect 421e. The gate 411b of the transistors 418p may be coupled to the interconnect 421e that may be coupled to the interconnect 431d that may be the power supply voltage line VSS 47, thus the transistor 418p may have an inversion region 441d at a channel portion of the transistor 418p that functions as a capacitor. The gate 411c of the transistor 418n may be coupled to the interconnect 421d that may be coupled to the interconnect 431c that may be the power supply voltage line VPERI 46, thus the transistor 418n may have an inversion region 441e at a channel portion of the transistor 418n that functions as a capacitor.

Figures 5A, 5B, 5C:
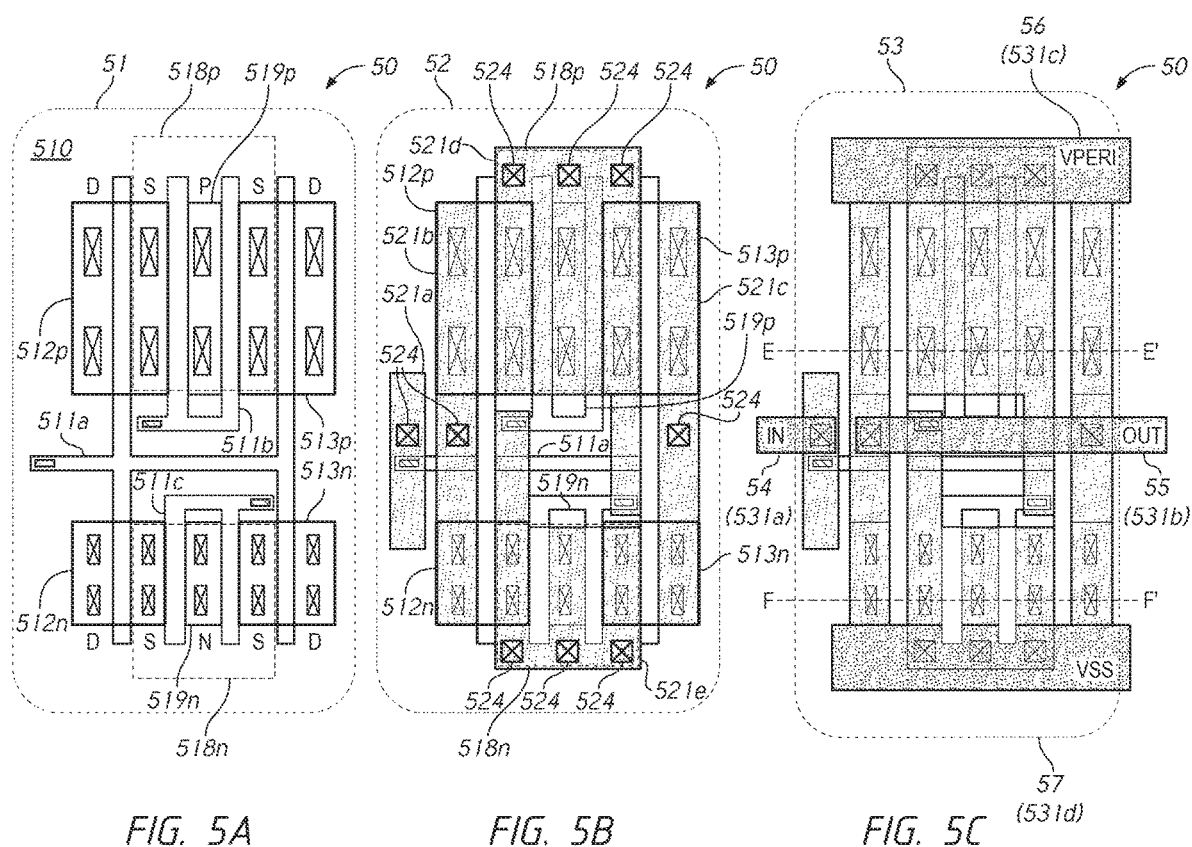
FIGS. 5A to 5C are layout diagrams of layers in a buffer circuit according to an embodiment of the present disclosure.
Figure 5D:
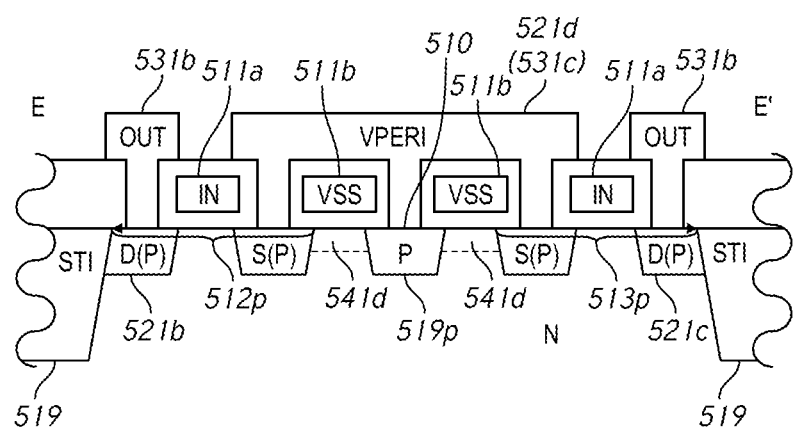
FIG. 5D is a schematic diagram of transistors in the buffer circuit according to an embodiment of the present disclosure.
Figure 5E:
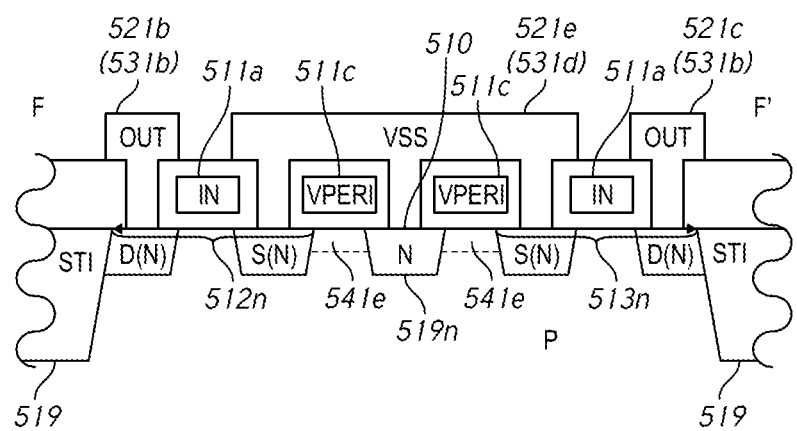
FIG. 5E is a schematic diagram of transistors in the buffer circuit according to an embodiment of the present disclosure.

FIGS. 5A to 5C are layout diagrams of layers 51, 52 and 53, respectively, in a buffer circuit 50 according to an embodiment of the present disclosure. FIG. 5D is a schematic diagram of transistors 512p and 513p in the buffer circuit 50 according to an embodiment of the present disclosure. FIG. 5E is a schematic diagram of transistors 512n and 513n in the buffer circuit 50 according to an embodiment of the present disclosure. FIGS. 5A to 5C are plan views of the layers 51, 52 and 53 in the buffer circuit 50 of multi-level wiring structure. FIGS. 5D and 5E are cross sectional views of the buffer circuit 50 along lines E-E' and F-F' shown in FIG. 4C. Description of components corresponding to components included in FIGS. 4A to 4E will not be repeated. The buffer circuit 50 may further include a P-type region 519p and an N-type region 519n. As shown in FIGS. 5A and 5D, a gate electrode 511b of a transistor 518p provided on an active region 510 of the layer 51 may be branched into two portions coupled to each other at one end, one portion disposed between the P-type region 519p and the transistor 512p (e.g., the source region of the transistor 512p), and the other portion disposed between the P-type region 519p and the transistor of 513p (e.g., the source region of the transistor 513p). Thus, the P-type region 519p may be provided between these two portions of the gate electrode 511b, further between the transistors 512p and 513p. In this manner, a distance between the transistors 512p and 513p of two inverters may become longer than a buffer circuit without such additional P-type region. Similarly, as shown FIGS. 5A and 5E, a gate electrode 511c of a transistor 518n provided on an active region 510 of the layer 51 may be branched into two portions, one portion disposed between the N-type region 519n and the transistor the transistor 512n (e.g., the source region of the transistor 512n) and the other portion disposed between the N-type region 519n and the transistor 513n (e.g., the source region of the transistor 513n). Thus, the N-type region 519n may be provided between these two portions of the gate electrode 511c, further between the transistors 512n and 513n. In this manner, a distance between the transistors 512n and 513n of two inverters may become longer than a buffer circuit without such additional N-type region.

Figures 6A, 6B:
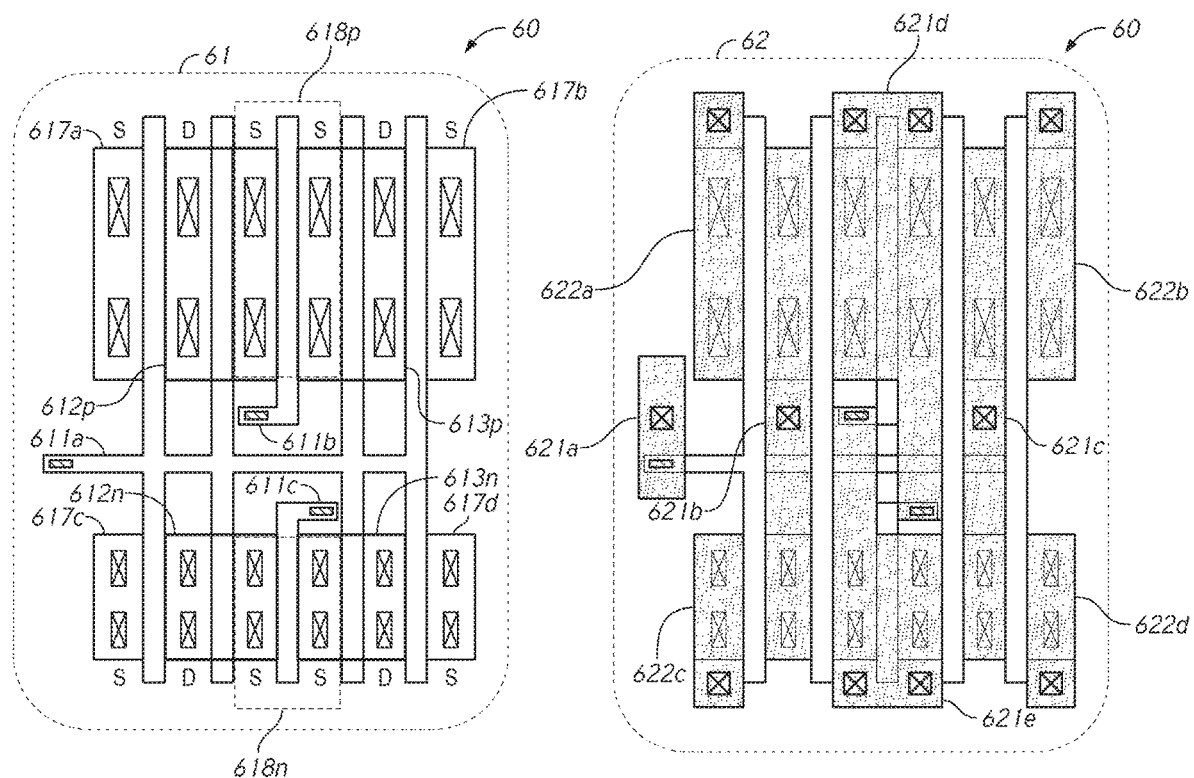
FIGS. 6A to 6C are layout diagrams of layers in a buffer circuit according to an embodiment of the present disclosure.
Figure 6C:
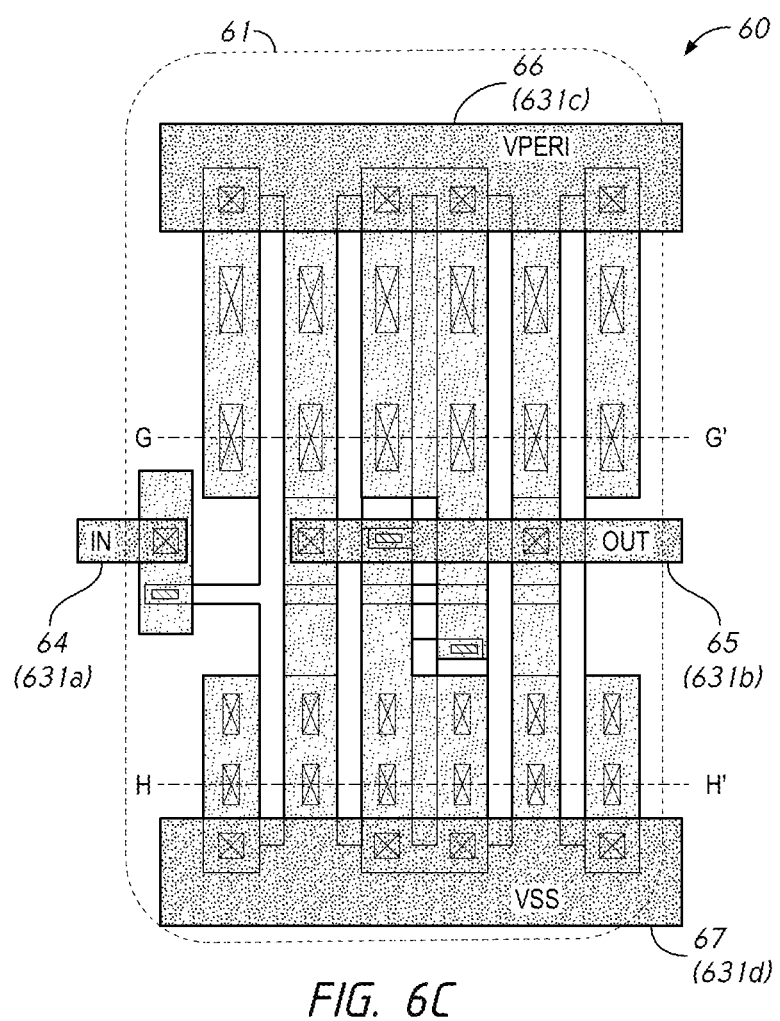
Figure 6D:
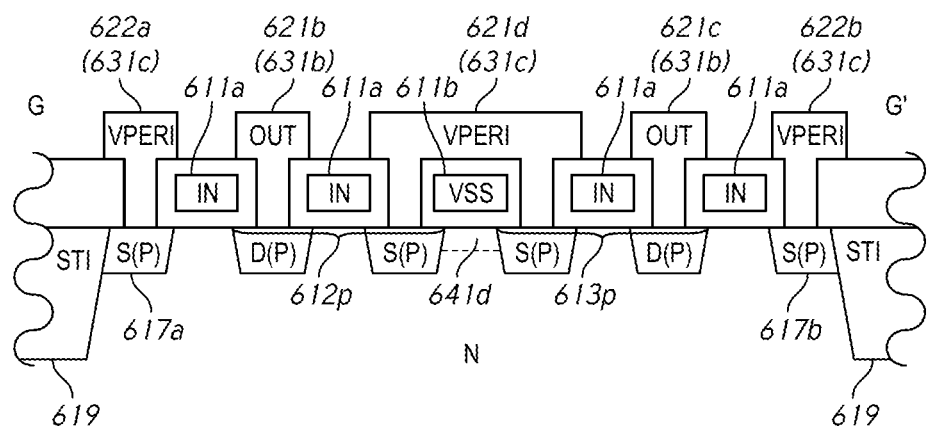
FIG. 6D is a schematic diagram of transistors in the buffer circuit according to an embodiment of the present disclosure.
Figure 6E:
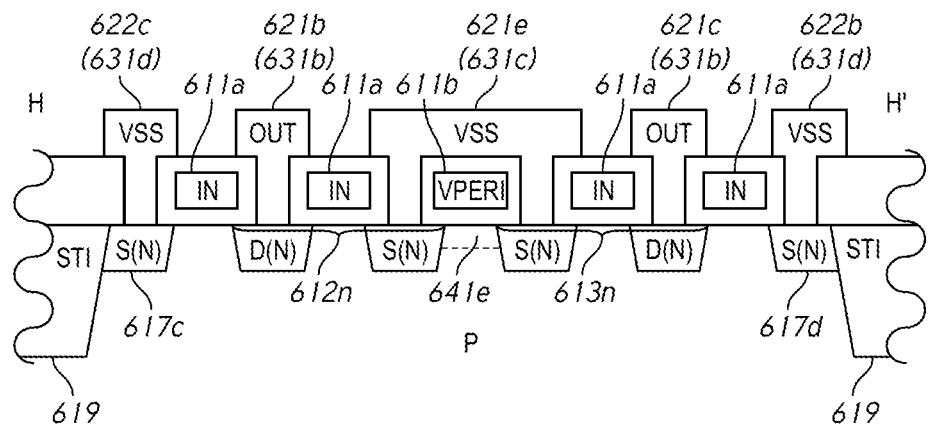
FIG. 6E is a schematic diagram of transistors in the buffer circuit according to an embodiment of the present disclosure.

FIGS. 6A to 6C are layout diagrams of layers 61, 62 and 63, respectively, in a buffer circuit 60 according to an embodiment of the present disclosure. FIG. 6D is a schematic diagram of transistors 612p and 613p in the buffer circuit 60 according to an embodiment of the present disclosure. FIG. 6E is a schematic diagram of transistors 612n and 613n in the buffer circuit 60 according to an embodiment of the present disclosure. FIGS. 6A to 6C are plan views of the layers 61, 62 and 63 in the buffer circuit 60 of multi-level wiring structure. FIGS. 6D and 6E are cross sectional views of the buffer circuit 60 along lines G-G' and H-H' shown in FIG. 6C. Description of components corresponding to components included in FIGS. 4A to 4E will not be repeated. The transistors 612p and 612n may be used as the transistors 22p and 22n in the inverter 22 in FIG. 2 and the transistors 613p and 613n may be used as the transistors 23p and 23n in the inverter 23 in FIG. 2. The buffer circuit 60 may further include a plurality of source regions 617a, 617b, 617c and 617d. As shown in FIGS. 6A and 6D, a common gate electrode 611a may be branched into a plurality of portions, including first, second, third and fourth portions. A drain region D of the transistor 612p may be disposed between the first portion and the second portion of the common gate electrode 611a. The first portion of the common gate electrode 611a may be disposed between a source region S 617a and the drain region D of the transistor 612p. The second portion of the common gate electrode 611a may be a gate of the transistor of 612p, disposed between the source region S and the drain region D of the transistor 612p. A drain region D of the transistor 612n may be disposed between the third portion and the fourth portion of the common gate electrode 611a. The third portion of the common gate electrode 611a may be disposed between a source region S 617c and the drain region D of the transistor 612n. The fourth portion of the common gate electrode 611a may be a gate of the transistor of 612n, disposed between the source region S and the drain region D of the transistor 612n.

Figure 7:
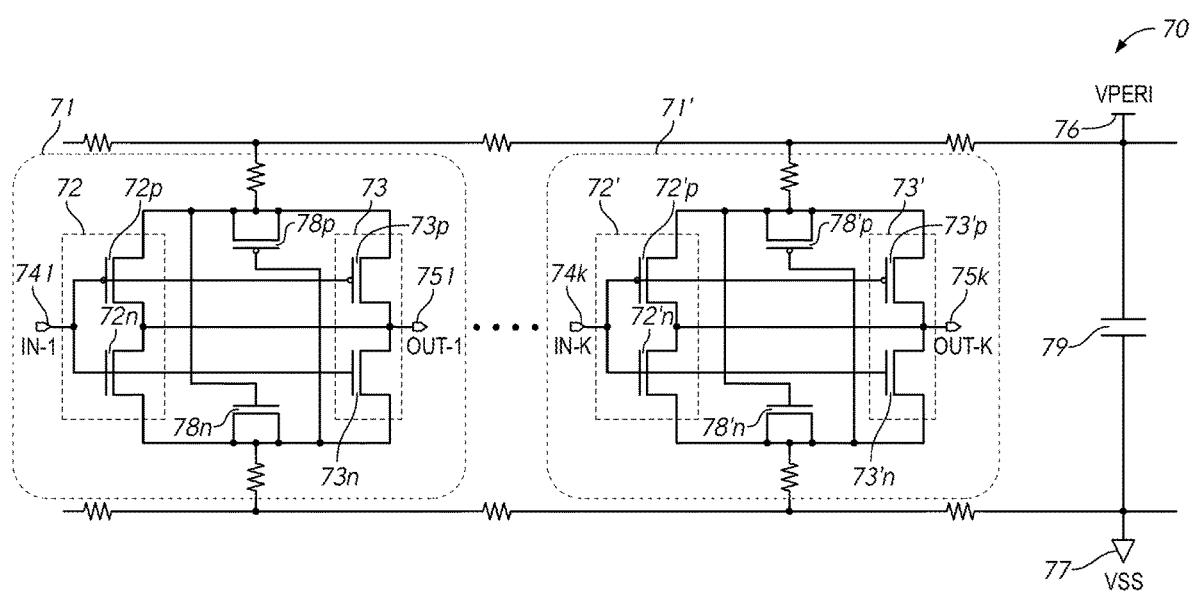
FIG. 7 is a circuit diagram of an apparatus including a plurality of buffer circuits according to an embodiment of the present disclosure.

FIG. 7 is a circuit diagram of an apparatus 70 including a plurality of buffer circuits according to an embodiment of the present disclosure. The plurality of buffer circuits may include inverter buffer circuits 71 and 71', and the plurality of buffer circuits may be coupled in parallel between power supply voltage lines VPERI 76 and VSS 77. In FIG. 7, the number of the plurality of buffer circuits shown is two, however, the number of buffer circuits may correspond to a number of input signals "k" that is a natural number, and thus the number of buffer circuits may not be limited to two. The buffer circuit 21 of FIG. 2 may be used as each of the plurality of buffer circuits, thus description of components corresponding to components included in the buffer circuit 21 of FIG. 2 will not be repeated. The plurality of buffer circuits may receive a plurality of input signals IN-1 to IN-k and may further provide a plurality of output signals OUT-1 to OUT-k. The buffer circuit 71 may receive the input signal IN-1 at an input node IN-1 741 and inverters 72 and 73 may receive the input signal IN-1 at gates of transistors, 72p, 72n, 73p, and 73n and may further provide the output signal OUT-1 from drains of the transistors 72p, 72n, 73p, and 73n. The buffer circuit 71 may also include transistors 78p and 78n that function as capacitors coupled between the power supply voltage lines VPERI 76 and VSS 77, and gates of the transistors 78p and 78n may receive the input signal IN-1. The source and drain regions of the transistor 78p may be coupled to the source regions of the transistors 72p and 73p respectively. The source and drain regions of the transistor 78n may be coupled to the source regions of the transistors 72n and 73n respectively. Similarly, the buffer circuit 71' may receive the input signal IN-k at an input node IN-k 74k and inverters 72' and 73' may receive the input signal IN-k at gates of transistors, 72'p, 72'n, 73'p, and 73'n and may further provide the output signal OUT-k from drains of the transistors 72'p, 72'n, 73'p, and 73'n. The buffer circuit 71' may also include transistors 78'p and 78'n that function as capacitors coupled between the power supply voltage lines VPERI 76 and VSS 77, and gates of the transistors 78'p and 78'n may receive the input signal IN-k. The source and drain regions of the transistor 78'p may be coupled to the source regions of the transistors 72'p and 73'p respectively. The source and drain regions of the transistor 78'n may be coupled to the source regions of the transistors 72'n and 73'n respectively.

In FIG. 7, the apparatus 70 may further include resistors on wirings, representing stray resistance caused by wire resistance of the power supply voltage lines VPERI 76 and VSS 77 and contact resistance caused by contact holes coupling the multi-level wiring layers. The apparatus 70 may further include a power voltage compensation capacitor 79 may be arranged on the one end closer to output nodes. The power voltage compensation capacitor 79 may be coupled between power supply voltage lines VPERI 76 and VSS 77 to suppress fluctuations in power supply voltages caused by switching of the plurality of buffer circuits. Together with transistors of each buffer circuit (e.g., transistors 78p 78n, and transistors 78'p, 78'n) that function as power voltage compensation capacitors, the power voltage compensation capacitor 79 may stabilize the power supply voltage VPERI 76 and VSS 77.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present disclosure herein should not be limited by the particular disclosed embodiments described above.

What is claimed is:

1. An apparatus comprising:
a first transistor of a first type including a first gate, a first source region and a first drain region;
a second transistor of the first type including a second gate, a second source region and a second drain region;
a third transistor of the first type including a third gate, a third source region and a third drain region; and
an electrode including the first gate and the second gate,
wherein the first source region is coupled to the second source region, and
wherein the third source region is coupled to the second drain region.

2. The apparatus of claim 1, wherein the first source region and the third source region are separated by the second gate.

3. The apparatus of claim 1; wherein the first gate and the second gate are coupled to an interconnect that is coupled to an input node configured to receive an input signal.

4. An apparatus comprising:
a first transistor of a first type;
a second transistor of the first type;
a layer including:
a region; and
a first electrode over the region, the first electrode including a gate of the first transistor and the gate of the second transistor,
wherein the layer is a first layer and further comprising a second layer on the first layer, wherein the second layer is a conductive layer.

5. The apparatus of claim 4, wherein the second layer includes an interconnect coupled to the first electrode.

6. The apparatus of claim 4, wherein the second layer is a metal layer.

7. The apparatus of claim 6, wherein the metal layer includes Tungsten.

8. An apparatus comprising:
a first transistor;
a second transistor;
a first layer including:
a region; and
a first electrode over the region, the first electrode including a gate of the first transistor and the gate of the second transistor;
a second layer on the first layer, the second layer is a conductive layer and includes an interconnect coupled to the first electrode; and
an inverter including the first transistor and a third transistor, wherein the interconnect is a first interconnect and the second layer further includes the first interconnect and a second interconnect,
wherein the second interconnect s coupled to a drain of the first ra sistor and a drain of the third transistor.

9. An apparatus comprising:
a first transistor;
a second transistor;
a first layer including:
a region; and
a first electrode over the region, the first electrode including a gate of the first transistor and the gate of the second transistor; and
a second layer on the first layer, the second layer is a conductive layer and includes an interconnect coupled to the first electrode,
wherein the interconnect is a first interconnect and the second layer further includes the first interconnect and a second interconnect,
wherein the second interconnect is configured to couple a gate of the third transistor to a source region of the first transistor, a source region of the second transistor.

10. The apparatus of claim 9, further comprising a fourth transistor,
wherein the source region of the first transistor is a source region of the fourth transistor, and the source region of the second transistor is a drain region of the fourth transistor.

11. An apparatus comprising:
a first transistor;
a second transistor;
a first layer including:
a region; and
a first electrode over the region, the first electrode including a gate of the first transistor and the gate of the second transistor;
a second layer on the first layer, the second layer is a conductive layer and includes an interconnect coupled to the first electrode; and
a third layer on the second layer,
wherein the interconnect is a first interconnect and the third layer is a conductive layer including a second interconnect which is coupled to the first interconnect, and
wherein the second interconnect is an input node configured to receive the input signal.

12. The apparatus of claim 11, wherein the third layer is a metal layer different from the second layer.

13. The apparatus of claim 11, wherein the third layer includes copper.

14. An apparatus comprising:
a layer including a region, the layer including:
a first electrode on the region, including a gate of a first transistor and a gate of a second transistor; and
a second electrode on the region, including a gate of a third transistor,
wherein the gate of the first transistor and the gate of the second transistor are separated by the gate of the third transistor.

15. The apparatus of claim 14, wherein the layer further includes a shallow trench isolation (STI) configured to define the region,
wherein the first electrode and the second electrode are formed over the region defined by the STI.

16. The apparatus of claim 15, wherein the layer further includes a dielectric film configured coat each electrode of the first electrode and the second electrode.

17. The apparatus of claim 15, further includes impurity implantation/diffusion, wherein the STI is configured to mask the first electrode and the second electrode, and wherein impurity implantation/diffusion is configured to form source and drain regions of the first, second and the third transistors.

18. The apparatus of claim 14, wherein the layer is a first layer, and further comprising forming a second layer on the first layer,
wherein the second layer is a conductive layer including an interconnect, and
wherein the interconnect is coupled to the first electrode and further configured to provide an input signal to the first electrode.

19. The apparatus of claim 18, further comprising:
an interlayer insulating film over the first layer; and
a contact hole in the interlayer insulating film to expose a portion of the first electrode,
wherein the interconnect is coupled to the first electrode through the contact hole.

* * * * *